(12) United States Patent
Abedifard

(10) Patent No.: US 6,275,446 B1
(45) Date of Patent: Aug. 14, 2001

(54) CLOCK GENERATION CIRCUITS AND METHODS

(75) Inventor: Ebrahim Abedifard, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/648,703

(22) Filed: Aug. 25, 2000

(51) Int. Cl.$^7$ ........................................................ G11C 8/00
(52) U.S. Cl. ........................ 365/233; 365/194; 365/230.08
(58) Field of Search ..................... 365/233, 194, 365/230.08, 233.5, 189.05, 191

(56) References Cited

U.S. PATENT DOCUMENTS

| | | |
|---|---|---|
| 5,041,886 | 8/1991 | Lee . |
| 5,537,354 | 7/1996 | Mochizuki et al. . |
| 5,600,605 | 2/1997 | Schaefer . |
| 5,666,321 | 9/1997 | Schaefer . |
| 5,751,039 | 5/1998 | Kauffman et al. . |
| 5,757,705 | 5/1998 | Manning . |
| 5,760,655 | 6/1998 | Roohparvar . |
| 5,787,457 | 7/1998 | Miller et al. . |
| 5,828,250 | 10/1998 | Konno . |
| 5,844,438 | 12/1998 | Lee . |
| 5,880,987 | 3/1999 | Merritt . |
| 5,907,186 | 5/1999 | Kang et al. . |
| 5,936,903 | 8/1999 | Jeng et al. . |
| 5,955,777 | 9/1999 | Corisis et al. . |
| 5,986,488 | 11/1999 | Merritt . |
| 5,995,438 | 11/1999 | Jeng et al. . |
| 6,014,339 | 1/2000 | Kobayashi et al. . |
| 6,016,283 | 1/2000 | Jeong . |
| 6,026,465 | 2/2000 | Mills et al. . |
| 6,044,026 | 3/2000 | Morgan . |
| 6,075,413 | 6/2000 | Katakura . |
| 6,081,575 | 1/2000 | Chevallier . |
| 6,083,777 | 7/2000 | King et al. . |
| 6,097,081 | 8/2000 | Masuda et al. . |

(List continued on next page.)

FOREIGN PATENT DOCUMENTS

355028542 * 2/1980 (JP) ...................................... 365/233

OTHER PUBLICATIONS

Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.

Micron, "16 Mb: x16 SDRAM" *Synchronous DRAM*, www.micron.com, copyright 1999 Micron Technology, Inc., pp. 1–51.

*Primary Examiner*—Trong Phan
*Assistant Examiner*—David Lam
(74) *Attorney, Agent, or Firm*—Thomas W. Leffert; Fogg, Slifer & Polglaze, P.A.

(57) ABSTRACT

Clock generator circuits containing a delay circuit having at least one delay element and at least one bypass are arranged to activate the bypass in response to a first logic level presented at the input of the delay circuit and to deactivate the bypass in response to a second logic level presented at the input of the delay circuit. Such clock generators are useful in synchronous memory devices for generating internal clock signals of fixed pulse width from an external clock signal. The internal clock signal is generated from a triggering event, such as a rising edge of the external clock signal, and has a pulse width determined by the delay time of the delay element. The first logic level is generated in response to the beginning of an output pulse of the clock generator while the second logic level is generated in response to the completion of an output pulse of the clock generator. Bypassing the delay element upon completion of an output pulse more quickly prepares the clock generator to receive the next triggering event.

53 Claims, 10 Drawing Sheets

U.S. PATENT DOCUMENTS

| | | |
|---|---|---|
| 6,107,677 | 8/2000 | Schoenfeld et al. . |
| 6,114,751 | 9/2000 | Kumakura et al. . |
| 6,115,836 | 9/2000 | Churchill et al. . |
| 6,130,114 | 10/2000 | Murakami et al. . |
| 6,137,133 | 10/2000 | Kauffman et al. . |
| 6,141,247 | 10/2000 | Roohparvar et al. . |
| 6,141,292 * | 10/2000 | Lee et al. .............................. 365/233 |
| 6,148,509 | 11/2000 | Schoenfeld et al. . |

* cited by examiner

| Left | Pin | Pin | Right |
|---|---|---|---|
| Vcc | 1* | 54 | Vss |
| DQ0 | 2 | 53 | DQ15 |
| VccQ | 3 | 52 | VssQ |
| DQ1 | 4 | 51 | DQ14 |
| DQ2 | 5 | 50 | DQ13 |
| VssQ | 6 | 49 | VccQ |
| DQ3 | 7 | 48 | DQ12 |
| DQ4 | 8 | 47 | DQ11 |
| VccQ | 9 | 46 | VssQ |
| DQ5 | 10 | 45 | DQ10 |
| DQ6 | 11 | 44 | DQ9 |
| VssQ | 12 | 43 | VccQ |
| DQ7 | 13 | 42 | DQ8 |
| Vcc | 14 | 41 | Vss |
| DQML | 15 | 40 | RP# |
| WE# | 16 | 39 | DQMH |
| CAS# | 17 | 38 | CLK |
| RAS# | 18 | 37 | CKE |
| CS# | 19 | 36 | VccP |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

(chip 150)

*Fig. 6A*

CLOCK GENERATION CIRCUITS AND METHODS

TECHNICAL FIELD OF THE INVENTION

The present invention relates generally to semiconductor memory devices, and in particular, the present invention relates to circuits and methods of generating internal clocks for synchronous memory devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, row and column decoder circuits coupled to the array of memory cells for accessing the array of memory cells in response to a decoded external address, and an address decoder circuit coupled to the row and column decoder circuits for decoding the external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

In synchronous system memories, an external clock signal drives individual synchronous memory devices in the system, and the synchronous memory devices perform specific data transfer operations, typically in response to the rising edges of the external clock signal. In a typical synchronous memory device, such as an SDRAM, a processor or some other external circuit applies address, data and transfer command information to the synchronous memory device. The synchronous memory device latches the address and command information on a particular rising edge of the external clock signal, and the processor knows that, at a predetermined number of clock cycles later, data may be read from the addressed synchronous memory device. During such data transfers, a clock generator circuit in the synchronous memory device develops an internal clock signal in response to the external clock signal, and the various components within the synchronous memory device are controlled in response to the internal clock signal. The clock generator circuit typically includes a one-shot circuit that operates to develop the internal clock signal in response to the external clock signal.

In modern system memories, the frequency of the external clock signal is ever increasing to enable data transfer to and from the synchronous memory devices at correspondingly faster rates. As the external clock frequency increases, operation of the one-shot circuit becomes more critical due to the corresponding frequency increase of the internal clock signal that must be developed by the one-shot circuit. Delays in recovery of the one-shot circuit may cause the one-shot circuit to miss the next rising edge of the external clock, thus causing a failure of the internal clock.

For the reasons stated above, and for other reasons stated below which will become apparent to those skilled in the art upon reading and understanding the present specification, there is a need in the art for alternate circuits and methods of generating internal clock signals for synchronizing commands in a synchronous memory device.

SUMMARY OF THE INVENTION

The above-mentioned problems with memory devices and other problems are addressed by the present invention and will be understood by reading and studying the following specification.

Various embodiments utilize clock generator circuits containing a delay circuit having at least one delay element and at least one bypass. These elements are arranged to activate the bypass in response to a first logic level presented at the input of the delay circuit and to deactivate the bypass in response to a second logic level presented at the input of the delay circuit. Such clock generators are useful in synchronous memory devices for generating internal clock signals of fixed pulse width from an external clock signal. The internal clock signal is generated from a triggering event, such as a rising edge of the external clock signal, and has a pulse width determined by the delay time of the delay elements. The first logic level may be generated in response to the beginning of an output pulse of the clock generator while the second logic level may be generated in response to the completion of an output pulse of the clock generator.

Bypassing the delay element upon completion of an output pulse more quickly prepares the clock generator to receive the next triggering event.

For one embodiment, the invention provides a clock generator. The clock generator includes an input buffer for receiving an external clock signal and a one-shot circuit coupled to the input buffer for providing output pulses in response to the external clock signal. The one-shot circuit includes a delay circuit having at least one delay element and at least one associated bypass. The one-shot circuit generates a first logic level in response to a completion of an output pulse and presents the first logic level to an input of the delay circuit. The first logic level activates the at least one associated bypass and propagates across each delay element substantially without delay. The one-shot circuit further generates a second logic level in response to a beginning of an output pulse and presents the second logic level to the input of the delay circuit. The second logic level deactivates the at least one associated bypass and is passed to the output of the delay circuit at a time delta equal to or greater than a predetermined delay time of the at least one delay element.

For another embodiment, the invention provides a clock generator. The clock generator includes an input buffer for receiving an external clock signal and a one-shot circuit coupled to the input buffer for providing output pulses in response to the external clock signal. The one-shot circuit includes a NAND SR latch having a set input, a reset input and an output. The set input is coupled to an output of the input buffer and an output pulse is provided on the output of the SR latch. The one-shot circuit further includes a delay circuit having an input and an output. The output of the delay circuit is coupled to the reset input of the SR latch. The input of the delay circuit is coupled to receive a first logic level indicative of a completion of an output pulse and to receive a second logic level indicative of a beginning of an output pulse. The delay circuit includes at least two delay elements coupled in series between the input and the output of the delay circuit and having a predetermined delay time, and at least two bypasses. Each bypass is associated with one delay element in a one-to-one relationship. Furthermore, each bypass is activated in response to the first logic level, thereby passing the first logic level across each delay element substantially without delay, and deactivated in response to the second logic level, thereby passing the second logic level from the input of the delay circuit to the output of the delay circuit at a time delta substantially equal to or greater than the predetermined delay time of the at least two delay elements.

For a further embodiment, the invention provides a memory device. The memory device includes an array of memory cells, a row access circuit coupled to the array of memory cells, a column access circuit coupled to the array of memory cells, an address decoder circuit coupled to the row access circuit and the column access circuit, and a clock generator for generating an internal clock signal for synchronizing access commands to the array of memory cells. The clock generator includes an input buffer for receiving an external clock signal and a one-shot circuit coupled to the input buffer for providing output pulses in response to the external clock signal. The one-shot circuit includes a NAND SR latch having a set input, a reset input and an output. The set input is coupled to an output of the input buffer and the internal clock signal is provided on the output of the SR latch as a series of output pulses. The one-shot circuit further includes a delay circuit having an input and an output. The output of the delay circuit is coupled to the reset input of the SR latch. The input of the delay circuit is coupled to receive a first logic level indicative of a completion of an output pulse of the internal clock signal and to receive a second logic level indicative of a beginning of an output pulse of the internal clock signal. The delay circuit includes at least two delay elements coupled in series between the input and the output of the delay circuit and having a predetermined delay time, and at least two bypasses. Each bypass is associated with one delay element in a one-to-one relationship. Furthermore, each bypass is activated in response to the first logic level, thereby passing the first logic level across each delay element substantially without delay, and deactivated in response to the second logic level, thereby passing the second logic level from the input of the delay circuit to the output of the delay circuit at a time delta substantially equal to or greater than the predetermined delay time of the at least two delay elements.

For a still further embodiment, the invention provides a synchronous flash memory device. The synchronous flash memory device includes a plurality of memory banks containing non-volatile flash memory cells and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator. The clock generator includes an input buffer for receiving the system clock input signal as an external clock signal and a one-shot circuit coupled to the input buffer for providing the internal clock signal in response to the external clock signal. The one-shot circuit includes a delay circuit having at least one delay element and at least one associated bypass. The one-shot circuit generates a first logic level in response to a completion of an output pulse of the internal clock signal and presents the first logic level to an input of the delay circuit. The first logic level activates the at least one associated bypass and propagates across each delay element substantially without delay. The one-shot circuit further generates a second logic level in response to a beginning of an output pulse of the internal clock signal and presents the second logic level to the input of the delay circuit. The second logic level deactivates the at least one associated bypass and is passed to the output of the delay circuit at a time delta equal to or greater than a predetermined delay time of the at least one delay element.

For yet another embodiment, the invention provides a method of generating output pulses of an internal clock signal in response to an external clock signal. The method includes applying a first signal indicative of the external clock signal to a set input of an SR latch and generating output pulses of the internal clock signal on an output of the SR latch in response to signals applied to the set input and a reset input of the SR latch. An output pulse begins in response to a falling edge of the first signal applied to the set input, and the output pulse is completed in response to a falling edge of a second signal applied to the reset input. The method further includes generating a first logic level indicative of a completion of an output pulse of the internal clock signal and generating a second logic level indicative of a beginning of an output pulse of the internal clock signal. The method still further includes applying the first and second logic levels to an input of a delay circuit having at least one delay element and at least one bypass where each delay element has an associated bypass. Each bypass is activated in response to the first logic level applied to the input of the delay circuit, thereby bypassing each delay element and passing the first logic level to an output of the delay circuit substantially without delay. Each bypass is deactivated in response to the second logic level applied to the input of the delay circuit, thereby allowing the second logic level to propagate through each delay element and passing the second logic level to the output of the delay circuit at a time delta substantially equal to a predetermined delay time of the at least one delay element. The method further includes applying the logic level from the output of the delay circuit to a reset input of the SR latch as the second signal.

For still another embodiment, the invention provides a delay circuit. The delay circuit includes at least one delay element coupled in series, and at least one bypass associated with each delay element. The input of each bypass is coupled to the input of its associated delay element and the output of each bypass is coupled to the output of its associated delay element. Each bypass has a first pass gate coupled between its input and output. Each first pass gate is activated in response to a first logic level presented at the input of the delay circuit and deactivated in response to a second logic level presented at the input of the delay circuit.

The invention further provides methods and apparatus of varying scope.

BRIEF DESCRIPTION OF THE DRAWINGS

FIG. 6A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figures 1A, 1B:
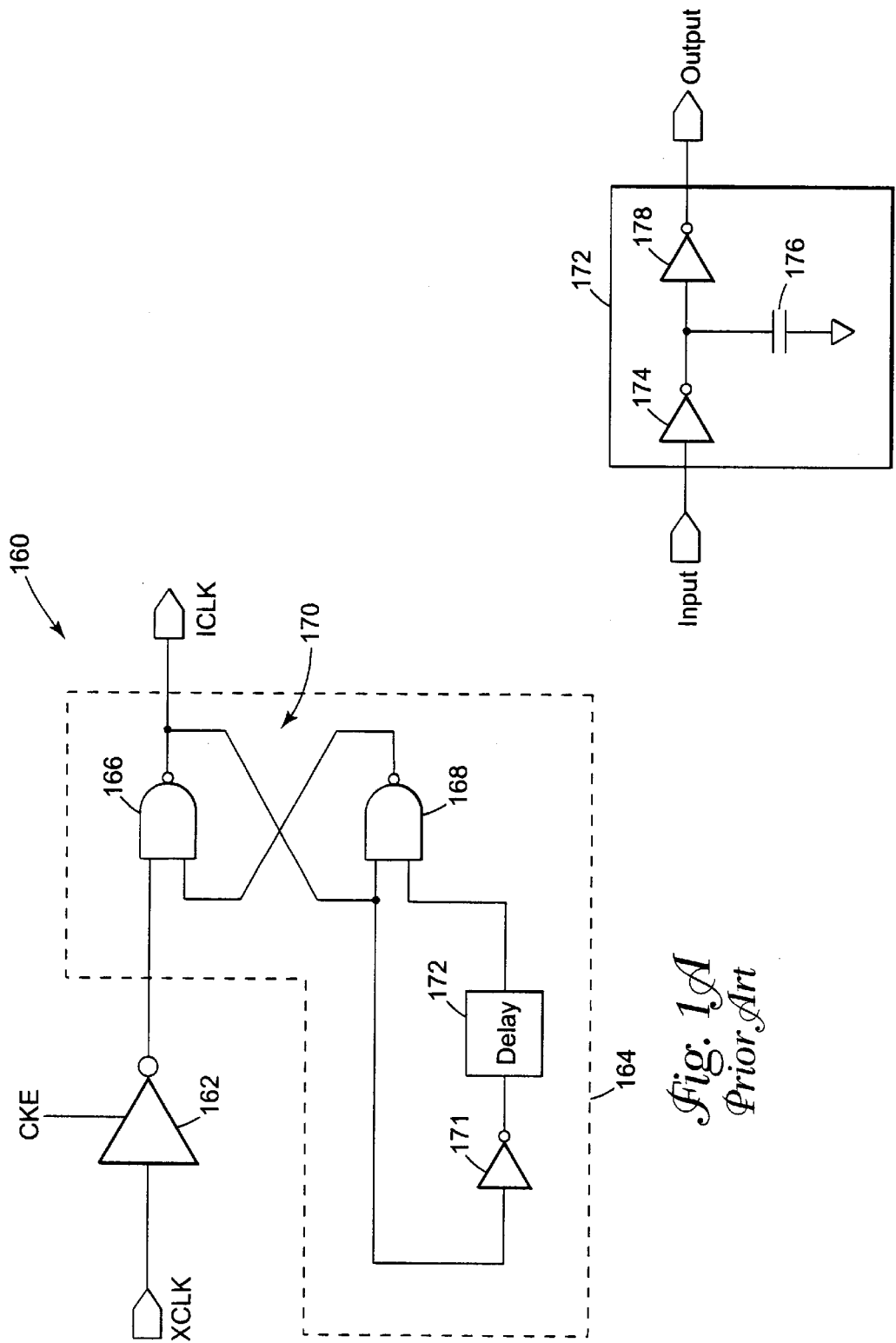
FIG. 1A is a schematic of a typical clock generator.
FIG. 1B is a schematic of a typical delay element.

FIG. 1A is a schematic of a simple internal clock generator 160 including an input buffer circuit 162 receiving an external clock signal XCLK supplied by an external circuit (not shown in FIG. 1A). The input buffer circuit 162 may further make use of a clock enable signal CKE to enable or disable the clock generator 160. The input buffer circuit 162 as shown inverts the external clock signal XCLK and develops an inverted clock signal on an output. The clock generator 160 further includes a one-shot circuit 164 receiving the inverted external clock signal and developing an internal clock signal ICLK in response to the external clock signal XCLK. The one-shot circuit 164 includes a pair of cross-coupled NAND gates 166 and 168 connected as shown to form a NAND SR latch 170, as known in the art. The input buffer circuit 162 provides on its output the SET pulse in response to the external clock signal XCLK going logic high. The SET pulse signal on the output of the input buffer circuit 162 is coupled to one input of the NAND gate 166 and operates to set or trigger the NAND SR latch 170 as the S (set) input of the NAND SR latch 170. A delay element 172 coupled to inverter 171 provides on its output a RESET pulse in response to the output of the NAND gate 166, and thus the internal clock signal ICLK, going logic high. The delay element 172 develops a low output a predetermined delay time, $t_d$, after the clock signal ICLK goes high. The RESET pulse signal on the output of the delay element 172 is coupled to one input of the NAND gate 168 and operates to reset the NAND SR latch 170 as the R (reset) input of the NAND SR latch 170. The duty cycle, and thus the pulse width, of the internal clock signal ICLK is dependent upon the predetermined delay time of the delay element 172; the higher the ratio of the delay to the period of the external clock signal XCLK, the higher the duty cycle of the internal clock signal ICLK.

One form of a non-inverting delay element is delay element 172 as shown in FIG. 1B. Delay element 172 contains a capacitor 176 interposed between two inverters 174 and 178. The amount of delay produced by delay element 172 is roughly determined by the capacitance value of the capacitor 176. In such capacitance-based delay elements, a delay will be experienced on both the rising and falling edges of the input signal. While the delay is desirable in determining the duty cycle of the internal clock signal ICLK, the delay also risks missing the SET pulse generated in response to the next rising edge of XCLK, thus applying an invalid condition on the NAND SR latch 170 should the RESET pulse still be low at the time of receiving the SET pulse.

The various embodiments of the invention seek to reduce the risk of missing the next triggering event of a clock generator, e.g., the rising edge of an external clock signal XCLK, by bypassing one or more delay elements of the clock generator upon completion of an output pulse of the clock generator, e.g., the falling edge of an internal clock signal. The various embodiments activate one or more bypasses in response to a first logic level indicative of completion of an output pulse, thus presenting the first logic level downstream of a delay element substantially without delay, and deactivate the bypass in response to a second logic level indicative of the beginning of an output pulse, thus presenting the second logic level downstream of the delay element at a time delta (time of output minus time of input) substantially equal to the predetermined delay time of the delay element.

Figure 2A:
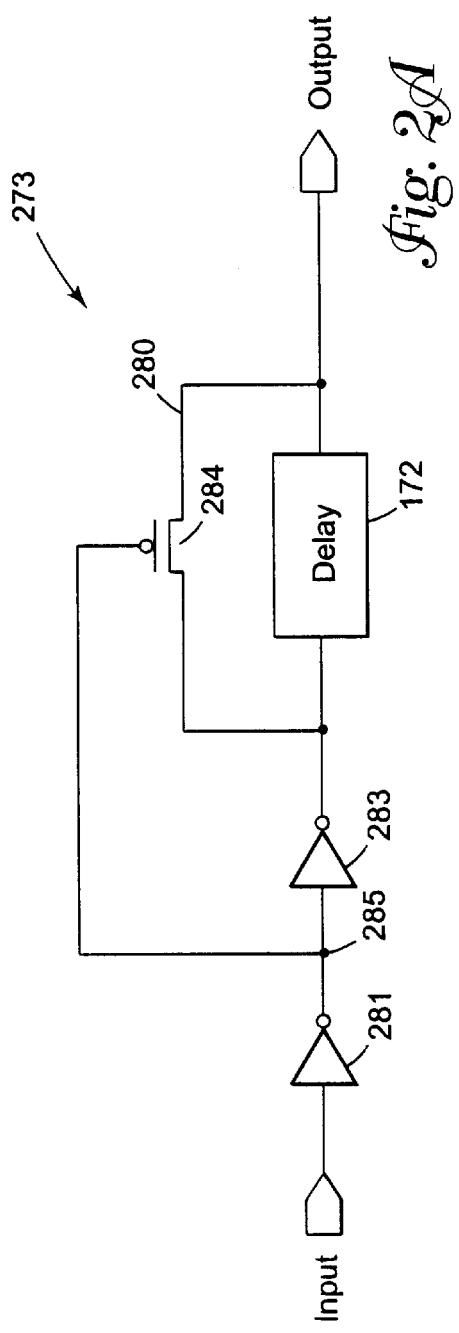
FIG. 2A is a schematic of a delay circuit having a single delay element in accordance with the invention.

FIG. 2A is a simple schematic of one embodiment of a delay circuit 273 having a non-inverting delay element 172 and a bypass 280 coupled in parallel with the delay element 172, i.e., the input of the bypass 280 is coupled to the input of the delay element 172 while the output of the bypass 280 is coupled to the output of the delay element 172. The bypass 280 in this example is a P-channel transistor 284 having its gate coupled to a node 285 interposed between the input of the delay circuit 273 the input of the delay element 172. For one embodiment, a first inverter 281 is interposed between the input of the delay circuit 273 and the node 285, and a second inverter 283 is interposed between the node 285 and the input of the delay element 172.

The control signal for activating the P-channel transistor 284, and thus the bypass 280, is the logic level presented at the input of the delay circuit 273. A first, high, logic level presented at the input of the delay circuit 273 is inverted by the first inverter 281 and presented to the gate of the P-channel transistor 284, thus activating the P-channel transistor 284. The second inverter 283 inverts the signal at node 285. This both restores the logic level to that presented at the input of the delay circuit 273 and provides sufficient delay to permit the P-channel transistor 284 to activate and bypass the delay element 172 before the delay element 172 has an opportunity to act on a transition to a high logic level presented at the input of the delay circuit 273. Accordingly, a high logic level will be passed to the output of the delay circuit 273 substantially without delay. Although it is recognized that the inverters 281 and 283, as well as all semiconductor devices, will produce some finite signal delay, this delay is generally nominal compared to the predetermined delay time of the delay element 172 and is thus considered to be substantially without delay.

A second, low, logic level presented at the input of the delay circuit 273 will be presented at the output of the delay circuit 273 at a time delta substantially equal to the predetermined delay time of the delay element 172. The delay element 172 may take the form of the delay element as discussed with reference to FIG. 1B having a capacitor interposed between two inverters. Those skilled in the art will recognize that other non-inverting delays may be used as the invention is not limited to the specifics of the delay element 172. Furthermore, the invention is not limited for use in clock generation circuits of the type described with reference to FIG. 1A having an NAND SR latch, but may be used with other clock generation circuits benefiting from a delay circuit having a predetermined delay time in response to a first event, such as a triggering event, and having substantially no delay time in response to a second event, such as a non-triggering event. It should be noted that the bypass 280 of FIG. 2A could easily be modified to activate in response to a logic low by replacing the P-channel transistor 284 with an N-channel transistor or by removing the inverters 281 and 283.

While the bypass 280 of FIG. 2A generally serves to bypass the delay element 172 in response to a logic high presented at the input to the delay element 172, and to allow a propagation delay of a logic low through the delay element 172, the signal level presented at the output of the P-channel transistor 284 will not produce a clean transition between logic levels. One method of providing a clean transition at the output of the bypass 280 is to replace the P-channel transistor with a complementary metal-oxide semiconductor (CMOS) pass gate having a first transistor of a first polarity and a second transistor of an opposite polarity.

Figure 2B:
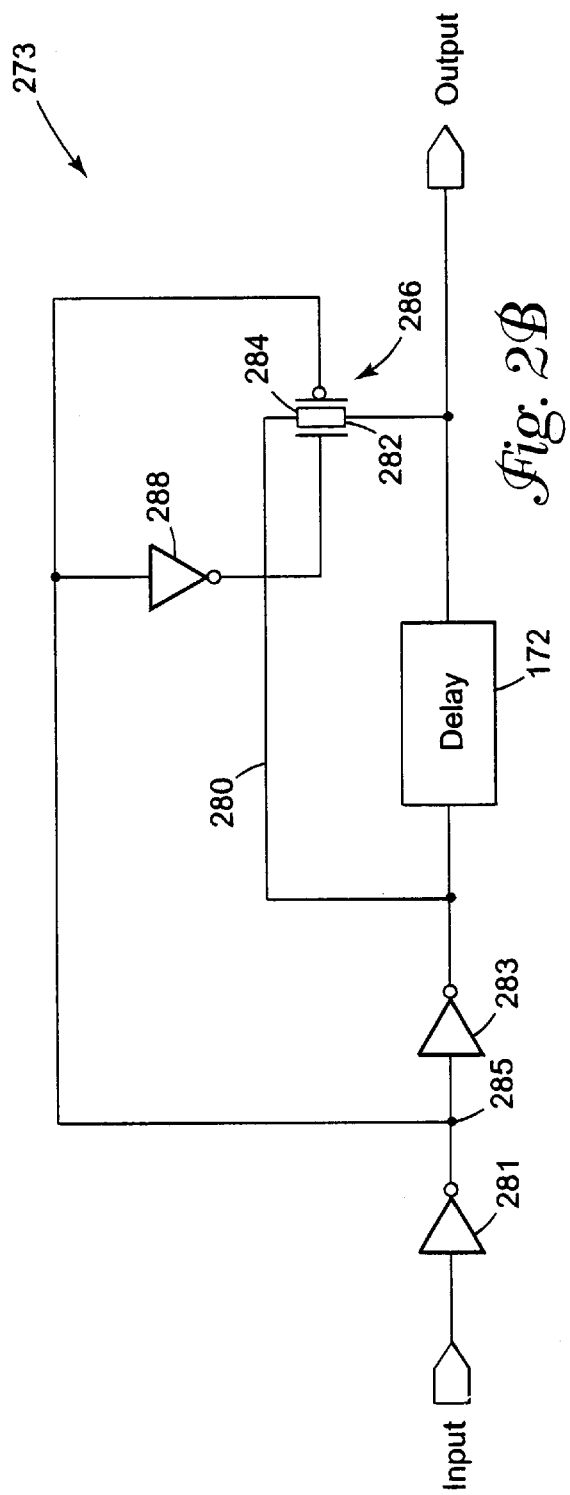
FIG. 2B is a schematic of a delay circuit having a single delay element in accordance with the invention.

FIG. 2B is a schematic of another embodiment of a delay circuit 273 having a non-inverting delay element 172 and a bypass 280. The bypass 280 of FIG. 2B contains a CMOS pass gate 286 having an N-channel transistor 282 and a P-channel transistor 284. The input of the pass gate 286 is coupled to the input of the delay element 172. The output of the pass gate 286 is coupled to the output of the delay element 172 and the output of the delay circuit 273. A first inverter 281 is interposed between the input of the delay circuit 273 and the node 285 while a second inverter 283 is interposed between the node 285 and the input of the delay element 172. The first inverter 281 conditions the incoming signal to activate the pass gate 286 in response to a high logic level presented at the input of the delay circuit 273. The second inverter 283 is interposed between the node 285 and the delay element 172 to restore the logic level of the incoming signal and to provide the desirable timing characteristics as discussed with reference to FIG. 2A. A third inverter 288 is interposed between the node 285 and the gate of the N-channel transistor 282. The gate of the N-channel transistor 282 is thus coupled to receive a control signal from the input of the delay element 172, as presented at node 285, through an interposing inverter. The gate of the P-channel transistor 284 is coupled to the node 285. The gate of the P-channel transistor 284 is thus coupled to receive the control signal from the input of the delay element 172, as presented at node 285.

In essence, pass gate 286 is responsive to the logic level presented at the input of the delay circuit 273 for selectively activating or deactivating the pass gate 286. The configuration shown in FIG. 2B presents much cleaner logic transitions across the bypass as compared to the bypass of FIG. 2A. It should be noted that while the bypass 280 of FIG. 2B is activated in response to a logic high presented at the input of the delay circuit 273, the circuit could easily be modified to activate in response to a logic low by repositioning the inverter 288 to be coupled between the node 285 and the gate of the P-channel transistor 284, with the gate of the N-channel transistor 282 coupled directly to the node 285. In this manner, the N-channel transistor 282 receives a control signal on its gate that is inverted from the logic level presented at the input of the delay circuit 273 while the P-channel transistor 284 receives a control signal on its gate that is non-inverted from the logic level presented at the input of the delay circuit 273.

Figure 2C:
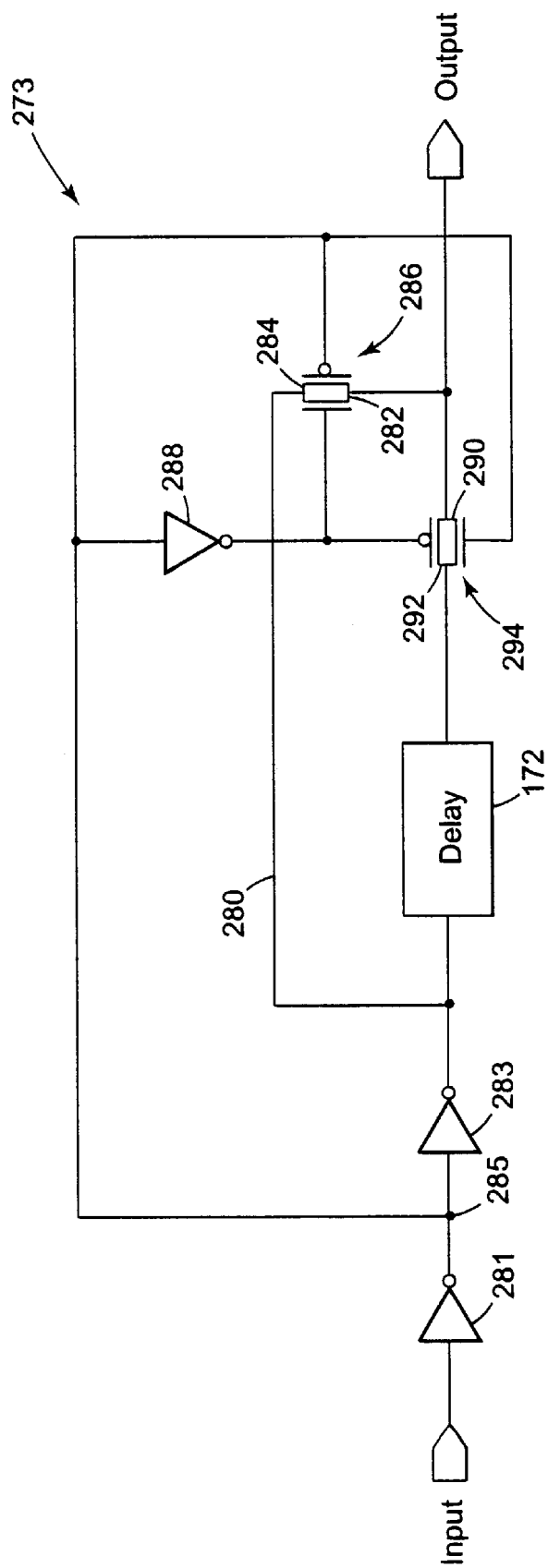
FIG. 2C is a schematic of a delay circuit having a single delay element in accordance with the invention.

While the bypasses of FIGS. 2A–2B generally serve to selectively bypass a delay element, it should be noted that the delay element will be driving an opposite logic level during the predetermined delay time, $t_d$. Driving an opposite logic level will result in unnecessary current draw as the output signal of the bypass struggles to overcome the opposite logic level presented as the output signal of the delay element. An additional pass gate inserted at the output of the delay element can be used to reduce this unnecessary current draw. FIG. 2C is a schematic of a further embodiment of a delay circuit 273 having a non-inverting delay element 172 and a bypass 280. The bypass 280 of FIG. 2C contains a first pass gate 286 having an N-channel transistor 282 and a P-channel transistor 284. The bypass 280 of FIG.

2C further contains a second pass gate 294 having an N-channel transistor 290 and a P-channel transistor 292. The input of the first pass gate 286 is coupled to the input of the delay element 172. The output of the first pass gate 286 is coupled to the output of the delay circuit 273. The first inverter 281 is interposed between the input of the delay circuit 273 and the node 285 while the second inverter 283 is interposed between the node 285 and the input of the delay element 172. An inverter 288 is interposed between the node 285 and the gate of the N-channel transistor 282. The gate of the P-channel transistor 284 is coupled to the node 285 interposed between the input of the delay circuit 273 and the input of the delay element 172.

The input of the second pass gate 294 is coupled to the output of the delay element 172. The output of the second pass gate 294 is coupled to the output of the first pass gate 286 and the output of the delay circuit 273. The gate of the P-channel transistor 292 is coupled to the gate of the N-channel transistor 282. The gate of the N-channel transistor 290 is coupled to the gate of the P-channel transistor 284.

As depicted, the control signal for selectively activating and deactivating the pass gates 286 and 294 is the logic level presented at the input of the delay circuit 273. In this manner, when a first logic level (a high logic level in this example) is presented at the input of the delay circuit 273, the output of the delay element 172 is electrically isolated through deactivation of the second pass gate 292 while the bypass 280 is activated through activation of the first pass gate 286. With the bypass 280 activated and the second pass gate 294 deactivated, the first logic level is presented at the output of the delay circuit 273 substantially without delay. Conversely, with a second logic level (a low logic level in this example) is presented at the input of the delay circuit 273, the bypass 280 is deactivated and the second pass gate 294 is activated. With the bypass 280 deactivated and the second pass gate 294 activated, the second logic level is presented at the output of the delay circuit 273 at a time delta substantially equal to the predetermined delay time of the delay element 172.

Figure 3A:
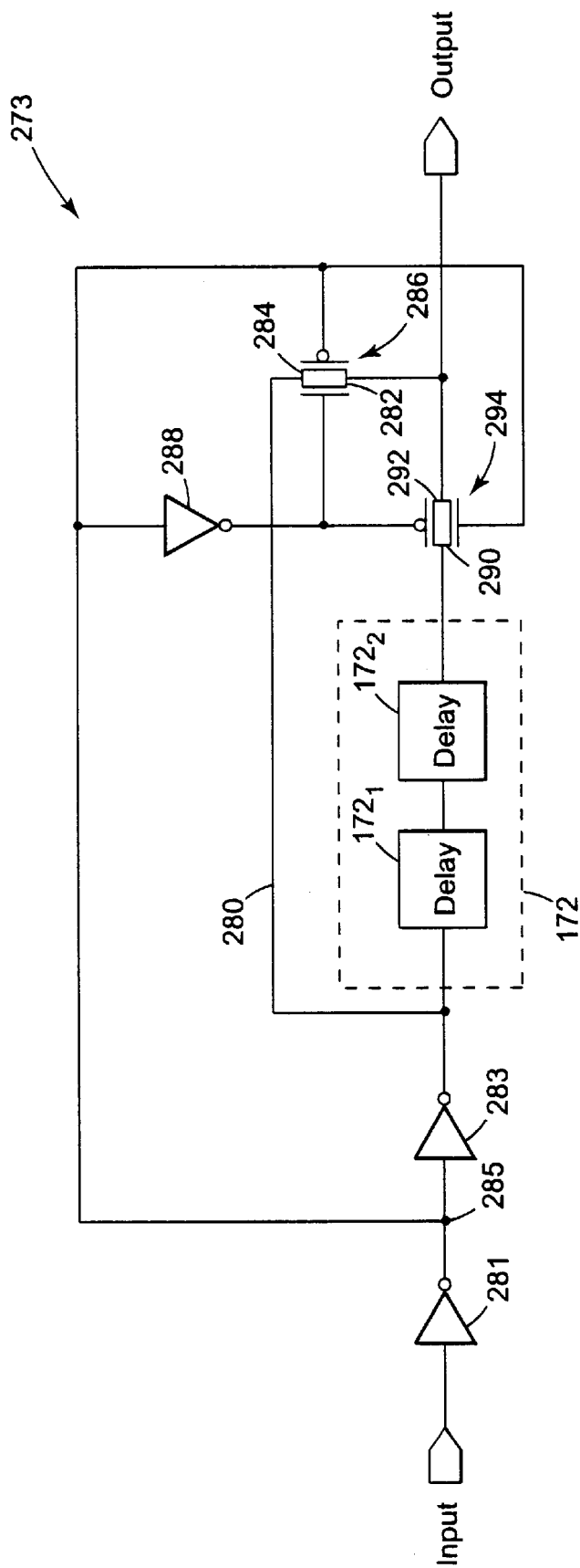
FIG. 3A is a schematic of a delay circuit having a chain of delay elements in accordance with the invention.
Figure 3B:
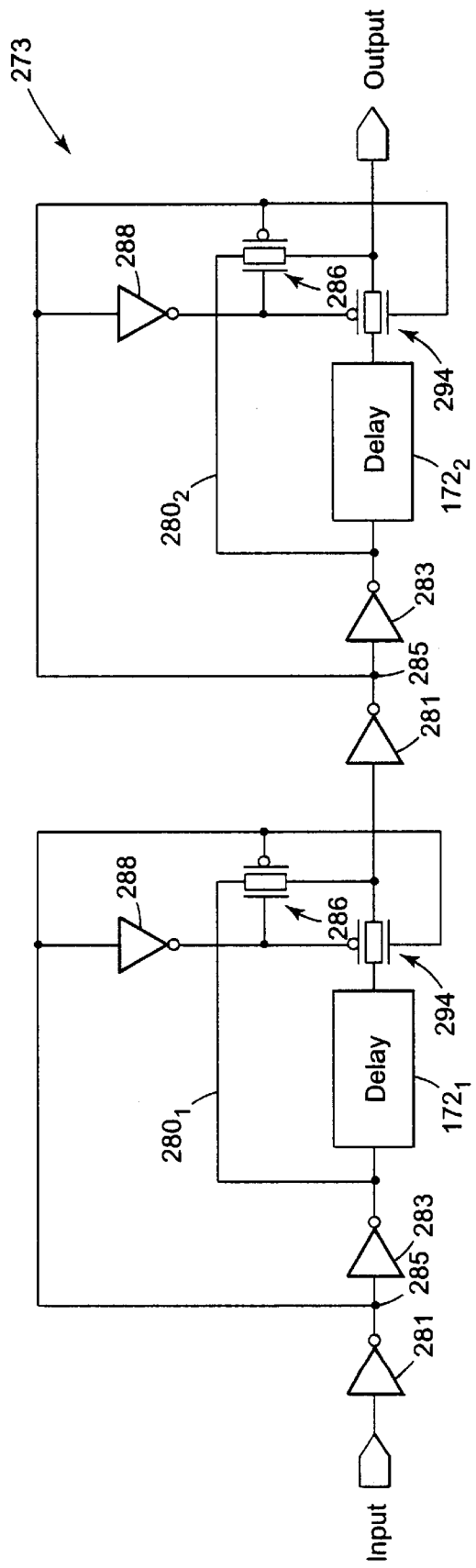
FIG. 3B is a schematic of a delay circuit having a chain of delay elements in accordance with the invention.
Figure 3C:
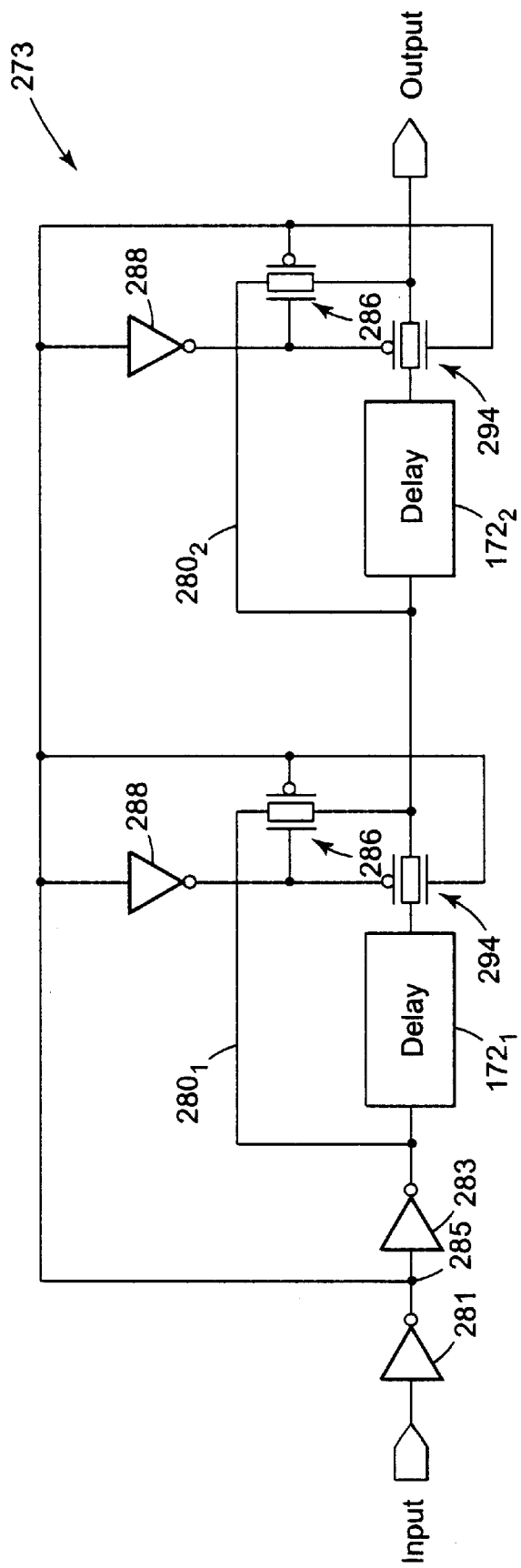
FIG. 3C is a schematic of a delay circuit having a chain of delay elements in accordance with the invention.

While the foregoing description relates primarily to bypassing a single delay element, a clock generation circuit may contain two or more delay elements. FIGS. 3A–3C are schematics of various embodiments showing examples of delay circuits containing multiple delay elements. Although each of the embodiments depicted in FIGS. 3A–3C make use of a bypass of the type depicted in FIG. 2C, bypasses of other embodiments may be substituted. Furthermore, while each of the embodiments depicted in FIGS. 3A–3C depict two delay elements, additional delay elements could be coupled in series and selectively bypassed as described. Delay times of delay elements coupled in series are generally additive.

FIG. 3A is a schematic showing one embodiment of a delay circuit bypassing multiple delay elements in series, i.e., a chain of delay elements. In this embodiment, a bypass 280, as described above, is coupled to allow bypassing of the chain of delay elements. The input of the bypass 280 is coupled to the input of the first delay element $172_1$ while the output of the bypass 280 is coupled to the output of the last delay element $172_2$, and thus the output of the delay circuit 273. Note that, in this configuration, the chain of delay elements $172_1$ and $172_2$ can collectively be thought of as a single delay element 172. Furthermore, the individual delay elements $172_1$ and $172_2$ could be inverting delays in this embodiment provided there are an even number of delay elements in the chain of delay elements such that the output of the chain of delay elements is non-inverting. The bypass circuit 280 is activated in response to a first, high, logic level presented at the input of the delay circuit 273. The first logic level is thus passed from the input to the output of the delay circuit 273 substantially without delay. The bypass circuit 280 is deactivated in response to a second, low, logic level presented at the input of the delay circuit 273. The second logic level is thus passed from the input to the output of the delay circuit 273 at a time delta substantially equal to the predetermined delay time of the chain of delay elements.

FIG. 3B is a schematic showing another embodiment of a delay circuit bypassing multiple delay elements in series. In this embodiment, each delay element in the chain of delay elements has an associated bypass. Each bypass is coupled to selectively bypass its associated delay element. A first bypass $280_1$, as described above, is coupled to selectively bypass a first delay element $172_1$ in response to a control signal from the input of its associated delay element $172_1$, and thus the input of the delay circuit 273. A second bypass $280_2$, as described above, is coupled to selectively bypass a second delay element $172_2$ in response to a control signal from the input of its associated delay element $172_2$. The bypass circuits $280_1$ and $280_2$ are each activated in response to a first, high, logic level presented at the input of the delay circuit 273 and as propagated to the nodes 285. The first logic level is thus passed from the input to the output of the delay circuit 273 substantially without delay. The bypass circuits $280_1$ and $280_2$ are each deactivated in response to a second, low, logic level presented at the input of the delay circuit 273. The second logic level is thus passed from the input to the output of the delay circuit 273 at a time delta substantially equal to the predetermined delay time of the chain of delay elements. As depicted, the gates of the P-channel transistors of the first pass gates 286 and the gates of the N-channel transistors of the second pass gates 294 are each coupled to receive a control signal from the input of their associated delay elements 172, as presented at nodes 285. Furthermore, the gates of the N-channel transistors of the first pass gates 286 and the gates of the P-channel transistors of the second pass gates 294 are each coupled to receive the control signal through an interposing inverter 288.

FIG. 3C is a schematic showing a further embodiment of a delay circuit 273 bypassing multiple delay elements in series. In this embodiment, as with the embodiment of FIG. 3B, each delay element in the chain of delay elements has an associated bypass. However, the embodiment of FIG. 3C differs in that the control signal for activating and deactivating the pass gates of each bypass is taken from node 285 interposed between the input of the delay circuit 273 and the input of the first delay element $172_1$ rather than from the input of each associated delay element as in FIG. 3B.

With reference to FIG. 3C, a first bypass $280_1$, as described above, is coupled to selectively bypass a first delay element $172_1$ in response to the input of the delay circuit 273. A second bypass $280_2$, as described above, is coupled to selectively bypass a second delay element $172_2$ directly in response to the input of the delay circuit 273. As with the embodiment of FIG. 3B, the bypass circuits $280_1$ and $280_2$ depicted in FIG. 3C are each activated in response to a first, high, logic level presented at the input of the delay circuit 273. The first logic level is thus passed from the input to the output of the delay circuit 273 substantially without delay. Furthermore, the bypass circuits $280_1$ and $280_2$ depicted in FIG. 3C are each deactivated in response to a second, low, logic level presented at the input of the delay circuit 273. The second logic level is thus passed from the input to the output of the delay circuit 273 at a time delta substantially equal to the predetermined delay time of the chain of delay elements. As depicted, the gates of the P-channel transistors of the first pass gates 286 and the gates of the N-channel transistors of the second pass gates 294 are each coupled to the node 285 interposed between the input of the delay circuit 273 and the input of the first delay element $172_1$. Furthermore, the gates of the N-channel transistors of the first pass gates 286 and the gates of the P-channel transistors of the second pass gates 294 are each coupled to the node 285 through an interposing inverter 288.

Figure 4:
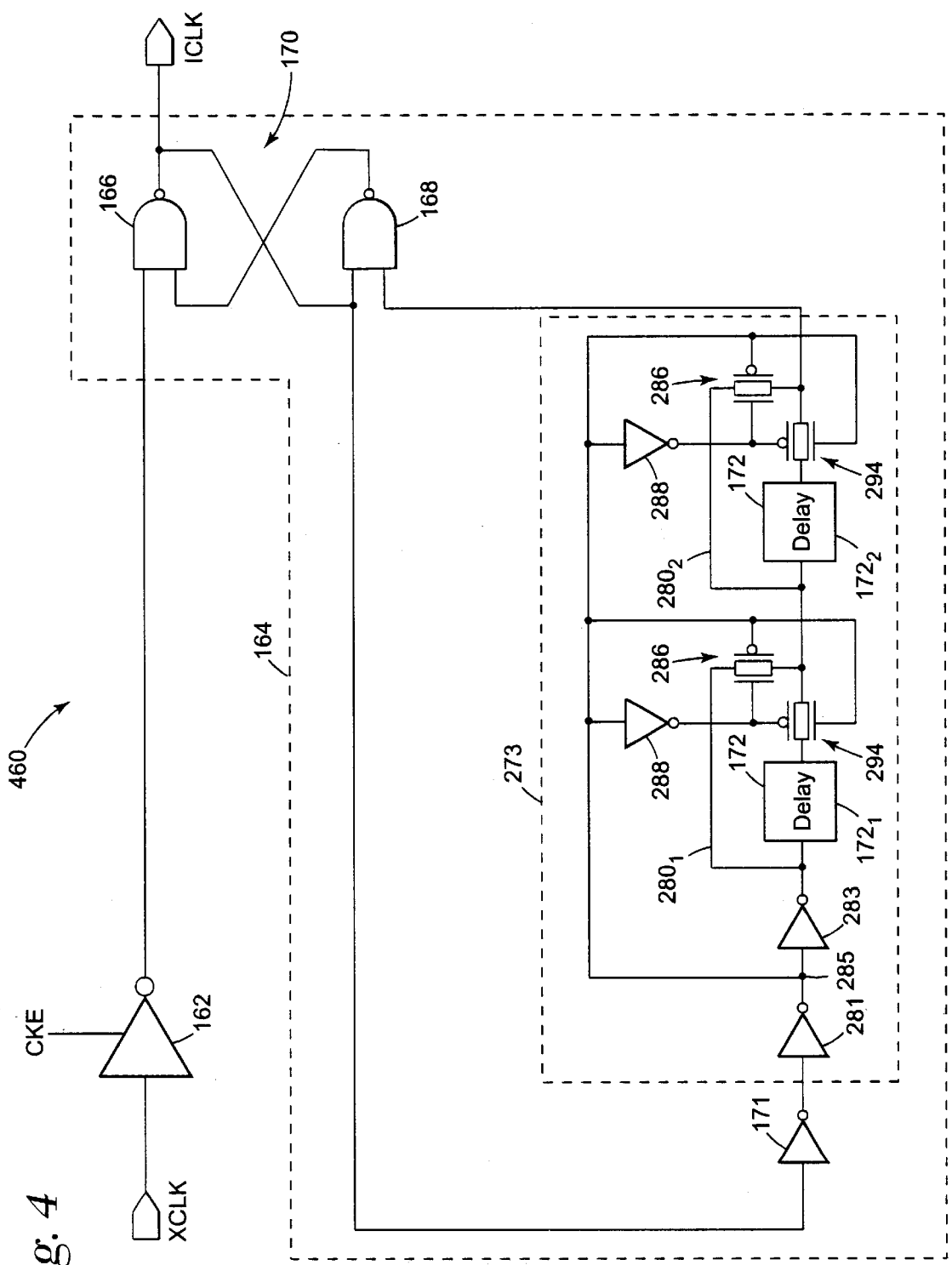
FIG. 4 is a schematic of a clock generator in accordance with the invention.

FIG. 4 is a schematic of a clock generator 460 in accordance with one embodiment of the invention. The clock generator 460 of FIG. 4 differs from the clock generator 160 of FIG. 1 in that the delay element 172 is replaced by a delay circuit 273 containing at least one delay element having a bypass. For the embodiment depicted in FIG. 4, the delay element 172 of clock generator 160 is replaced by a delay circuit 273 having delay elements $172_1$ and $172_2$ with bypasses $280_1$ and $280_2$, respectively. Elements of the clock generator 460 are as described with reference to like-numbered elements of FIGS. 1, 2A–2C and 3A–3C. Other delay circuits in accordance with the various embodiments of the invention may be substituted for delay circuit 273 of FIG. 4.

In the clock generator 460, the internal clock signal ICLK will go logic high in response to a rising edge of the external clock signal XCLK. The internal clock signal ICLK will be inverted by inverter 171 and presented to the input of the delay circuit 273 as a logic low. The logic low presented at the input of the delay circuit 273 will result in deactivation of the bypasses $280_1$ and $280_2$ and will be presented at the output of the delay circuit 273 at a time delta substantially equal to the predetermined delay time of the chain of delay elements $172_1$ and $172_2$. The logic low at the output of the delay circuit 273 will reset the NAND SR latch 170 and cause the internal clock signal ICLK to go logic low. The internal clock signal ICLK will again be inverted by inverter 171 and presented to the input of the delay circuit 273 as a logic high. The logic high presented at the input of the delay circuit 273 will result in activation of the bypasses $280_1$ and $280_2$, along with the isolation of the delay elements $172_1$ and $172_2$, and will be presented at the output of the delay circuit 273 substantially without delay. The NAND SR latch 170 is then ready to accept the next rising edge of the external clock signal XCLK as the next triggering event.

For another embodiment, the inverter 171 is repositioned to be interposed between the output of the delay circuit 273 and the NAND SR latch 170 such that the delay circuit 273 is passing a non-inverted internal clock signal ICLK. For such an embodiment, the delay circuit 273 would be modified to pass a low logic level substantially without delay. Accordingly, for this embodiment, the delay circuit 273 would be modified as described above for passing a low logic level substantially without delay, e.g., moving the inverters 288 to be interposed between the nodes 285 and the gates of the P-channel transistors of the pass gates 286. As such, the P-channel transistors of the pass gates 286 and the N-channel transistors of the pass gates 294 again receive a control signal non-inverted from the internal clock signal ICLK while the N-channel transistors of the pass gates 286 and the P-channel transistors of the pass gates 294 again receive a control signal inverted from the internal clock signal ICLK. In this manner, a first, low, logic level indicative of the completion of an output pulse of the one-shot circuit 164 is passed from the input of the delay circuit 273 to the output of the delay circuit 273 substantially without delay while a second, high, logic level indicative of the beginning of an output pulse of the one-shot circuit 164 is passed from the input of the delay circuit 273 to the output of the delay circuit 273 at a time delta substantially equal to the predetermined delay of the delay element.

Figure 5:
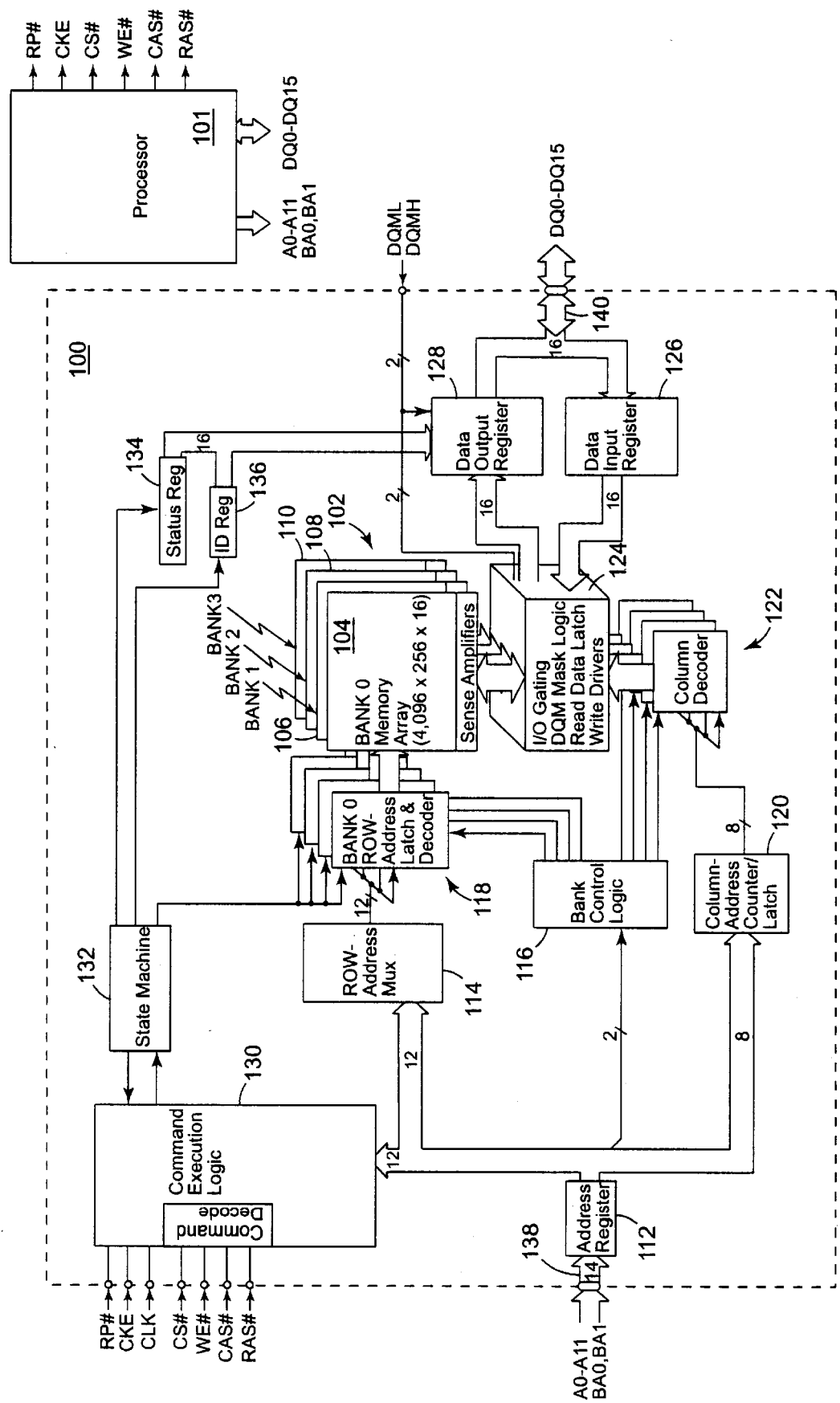
FIG. 5 is a block diagram of a memory device in accordance with the invention.

FIG. 5 is a block diagram of one embodiment of a synchronous memory device containing a clock generator in accordance with the invention. The memory device 100 includes an array of non-volatile flash memory cells 102. All access commands to the array 102 of the memory device 100 are synchronized to a system clock input signal (CLK), thus the memory device 100 may be referred to as a synchronous flash memory device. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. Command execution logic 130 contains a clock generator 460 in accordance with the various embodiments of the invention. The system clock input signal CLK acts as the external clock signal XCLK input to the clock generator 460. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 5 may be fabricated on a substrate, such as a semiconductor die, and may be referred to as a memory chip.

FIG. 6A illustrates an interconnect pin assignment of one embodiment of the present invention as a memory assembly having a pin layout substantially similar to a standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to the interconnect pins of the memory package 150 in a conventional manner. Two interconnects shown in the embodiment of FIG. 6A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned.

Figure 6B:
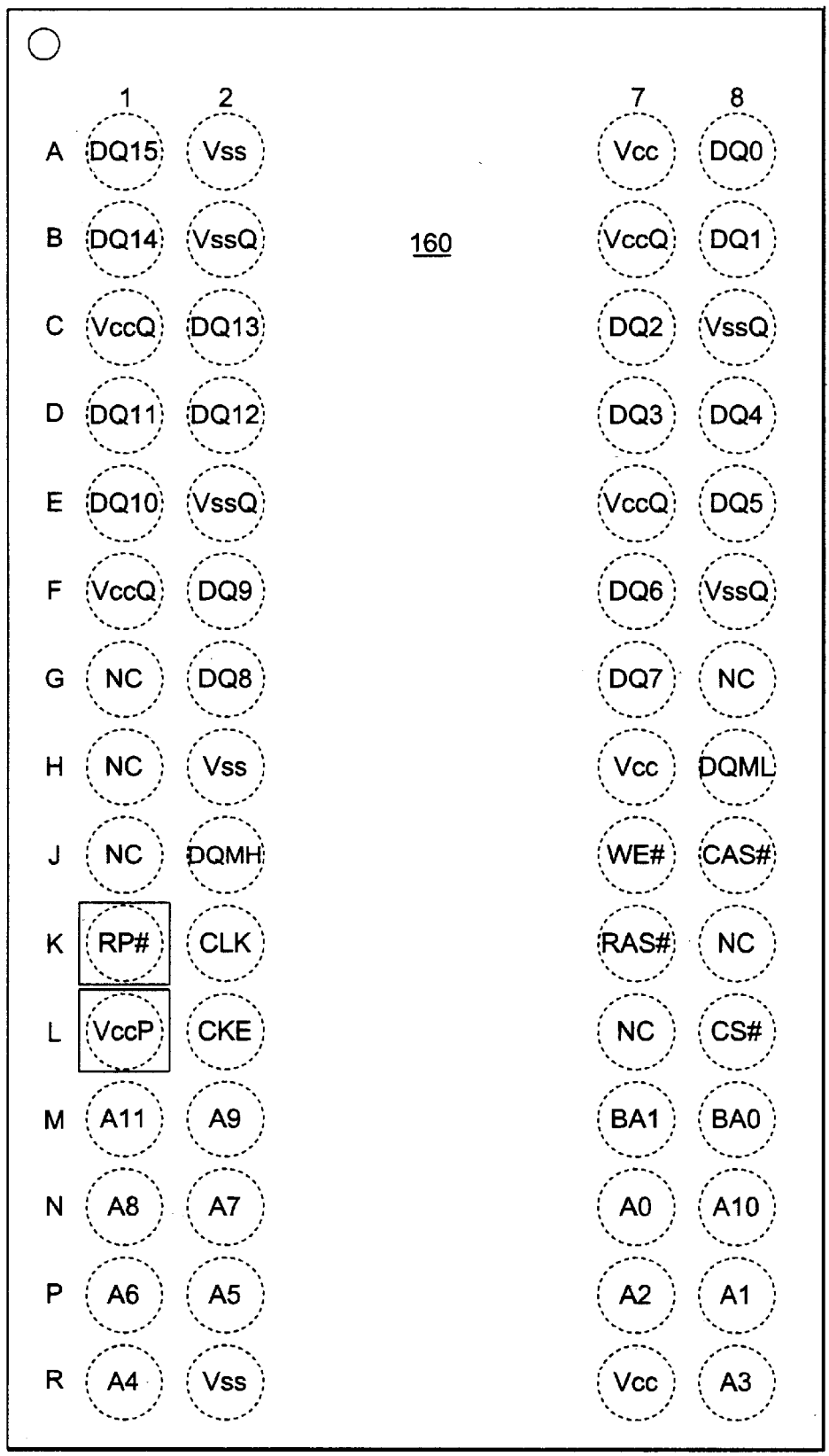
FIG. 6B is a top view of a memory assembly showing a package bump assignment diagram in accordance with the invention.

FIG. 6B illustrates a bump assignment of one embodiment of the present invention as a memory assembly having a bump layout substantially similar to an industry standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing a clock generator in accordance with the various embodiments of the invention.

CONCLUSION

Various embodiments of the invention have been shown for providing operational advantages in semiconductor memory devices through methods and circuits for selectively bypassing one or more delay elements of an internal clock generator. The various embodiments of the invention include clock generator circuits containing a delay circuit having at least one delay element and at least one bypass. The delay circuits are arranged to activate a bypass in response to a first logic level presented at the input of the delay circuit and to deactivate the bypass in response to a second logic level presented at the input of the delay circuit. Such clock generators are useful in synchronous memory devices for generating internal clock signals of fixed pulse width from an external clock signal. The internal clock signal is generated from a triggering event, such as a rising edge of the external clock signal, and has a pulse width determined by the delay time of the delay element. The first logic level is generated in response to, and is indicative of, the beginning of an output pulse of the clock generator while the second logic level is generated in response to, and is indicative of, the completion of an output pulse of the clock generator. Bypassing the delay element upon completion of an output pulse more quickly prepares the clock generator to receive the next triggering event. The various embodiments further include memory devices containing such clock generators, and memory assemblies containing such memory devices. Memory devices of the various embodiments have access commands synchronized to an external clock. Memory devices of certain embodiments contain arrays of non-volatile flash memory cells having access commands synchronized to an external clock.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, two or more capacitors may be used in a delay element for additional delay. Furthermore, a delay element may contain other logic functions and make use of additional input signals. In addition, delay circuits could have one or more delay elements not having an associated bypass such that a delay time in response to a first logic level would differ from a delay time in response to a second logic level, but neither logic level would be passed substantially without delay. In the first instance, the first logic level propagates across each bypassed delay element substantially without delay, but is passed to the output of the delay circuit at a time delta substantially equal to a predetermined delay time of the delay elements not having an associated bypass. In the second instance, the second logic level passes to the output of the delay circuit at a time delta substantially equal to the predetermined delay time of all delay elements, if coupled in series, and at a time delta substantially equal to the maximum of the delay time of the delay elements having an associated bypass or the delay time of the delay elements not having an associated bypass, in coupled in parallel. Accordingly, this application is intended to cover any adaptations or variations of the invention. It is manifestly intended that this invention be limited only by the following claims and equivalents thereof.

What is claimed is:

1. A clock generator, comprising:
   an input buffer for receiving an external clock signal; and
   a one-shot circuit coupled to the input buffer for providing output pulses in response to the external clock signal, wherein the one-shot circuit comprises a delay circuit having at least one delay element and at least one associated bypass;
   wherein the one-shot circuit generates a first logic level in response to a completion of an output pulse and presents the first logic level to an input of the delay circuit, further wherein the first logic level activates the at least one associated bypass and is passed to an output of the delay circuit substantially without delay; and
   wherein the one-shot circuit generates a second logic level in response to a beginning of an output pulse and presents the second logic level to the input of the delay circuit, further wherein the second logic level deactivates the at least one associated bypass and is passed to the output of the delay circuit at a time delta substantially equal to a predetermined delay time of the at least one delay element.

2. The clock generator of claim 1, wherein each at least one delay element comprises:
   a first inverter;
   a second inverter; and
   at least one capacitor interposed between the first inverter and the second inverter.

3. The clock generator of claim 1, wherein each at least one associated bypass comprises:
   an input;
   an output; and
   a first pass gate coupled between the input and output;
   wherein the input of each bypass is coupled to an input of its associated delay element and the output of each bypass is coupled to an output of its associated delay element.

4. The clock generator of claim 3, wherein each first pass gate has a first transistor of a first polarity having a gate coupled to a node interposed between the input of a first delay element and the input of the delay circuit, and a second transistor of an opposite polarity having a gate coupled to the node through an interposing inverter.

5. The clock generator of claim 4, further comprising:
   a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

6. The clock generator of claim 3, wherein each first pass gate has a first transistor of a first polarity having a gate coupled to receive a control signal from the input of its associated delay element and a second transistor of an opposite polarity having a gate coupled to receive the control signal through an interposing inverter.

7. The clock generator of claim 6, further comprising:

a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

8. A clock generator, comprising:

an input buffer for receiving an external clock signal; and a one-shot circuit coupled to the input buffer for providing output pulses in response to the external clock signal, wherein the one-shot circuit comprises a delay circuit having at least one delay element and at least one associated bypass;

wherein the one-shot circuit generates a first logic level in response to a completion of an output pulse and presents the first logic level to an input of the delay circuit, further wherein the first logic level activates the at least one associated bypass and propagates across each delay element substantially without delay; and wherein the one-shot circuit generates a second logic level in response to a beginning of an output pulse and presents the second logic level to the input of the delay circuit, further wherein the second logic level deactivates the at least one associated bypass and is passed to the output of the delay circuit at a time delta equal to or greater than a predetermined delay time of the at least one delay element.

9. The clock generator of claim 8, wherein the delay circuit further comprises at least one additional delay element coupled between the input and output of the delay circuit, such additional delay elements not having an associated bypass.

10. A clock generator, comprising:

an input buffer for receiving an external clock signal; and a one-shot circuit coupled to the input buffer for providing output pulses in response to the external clock signal, wherein the one-shot circuit comprises:

a NAND SR latch having a set input, a reset input and an output, wherein the set input is coupled to an output of the input buffer; and a delay circuit having an input and an output, at least one delay element having a predetermined delay time coupled in series between the input and the output of the delay circuit, and at least one bypass coupled between the input and the output of the delay circuit in parallel with the at least one delay element, wherein the output of the delay circuit is coupled to the reset input of the SR latch, further wherein the input of the delay circuit is coupled to receive a first logic level indicative of a completion of an output pulse and to receive a second logic level indicative of a beginning of an output pulse;

wherein the first logic level activates the at least one bypass and is passed from the input of the delay circuit to the output of the delay circuit substantially without delay; and wherein the second logic level deactivates the at least one bypass is passed from the input of the delay circuit to the output of the delay circuit at a time delta substantially equal to the predetermined delay time of the at least one delay element.

11. The clock generator of claim 10, wherein each at least one delay element comprises:

a first inverter;

a second inverter; and at least one capacitor interposed between the first inverter and the second inverter.

12. The clock generator of claim 10, wherein each at least one associated bypass comprises:

an input;

an output; and a first pass gate coupled between the input and output, wherein the first pass gate has a first transistor of a first polarity having a gate coupled to a node interposed between the input of the delay circuit and the input of a first delay element and wherein the first pass gate has a second transistor of an opposite polarity having a gate coupled to the node through an interposing inverter;

wherein the input of each bypass is coupled to an input of its associated delay element and the output of each bypass is coupled to an output of its associated delay element.

13. The clock generator of claim 12, further comprising:

a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

14. A clock generator, comprising:

an input buffer for receiving an external clock signal; and a one-shot circuit coupled to the input buffer for providing output pulses in response to the external clock signal, wherein the one-shot circuit comprises:

a NAND SR latch having a set input, a reset input and an output, wherein the set input is coupled to an output of the input buffer; and a delay circuit having an input and an output, at least one delay element having a predetermined delay time coupled in series between the input and the output of the delay circuit, and at least one bypass coupled between the input and the output of the delay circuit in parallel with the at least one delay element, wherein the output of the delay circuit is coupled to the reset input of the SR latch. further wherein the input of the delay circuit is coupled to receive a first logic level indicative of a completion of an output pulse and to receive a second logic level indicative of a beginning of an output pulse;

wherein the first logic level activates the at least one bypass and is passed across each delay element substantially without delay; and wherein the second logic level deactivates the at least one bypass is passed from the input of the delay circuit to the output of the delay circuit at a time delta substantially equal to or greater than the predetermined delay time of the at least one delay element.

15. A clock generator, comprising:
an input buffer for receiving an external clock signal; and
a one-shot circuit coupled to the input buffer for providing output pulses in response to the external clock signal, wherein the one-shot circuit comprises:
 a NAND SR latch having a set input, a reset input and an output, wherein the set input is coupled to an output of the input buffer and wherein an output pulse is provided on the output of the SR latch; and
 a delay circuit having an input and an output, wherein the output of the delay circuit is coupled to the reset input of the SR latch, further wherein the input of the delay circuit is coupled to receive a first logic level indicative of a completion of an output pulse and to receive a second logic level indicative of a beginning of an output pulse, still further wherein the delay circuit comprises:
  at least two delay elements coupled in series and having a predetermined delay time, wherein the at least two delay elements are coupled between the input and the output of the delay circuit; and
  at least two bypasses, wherein each bypass is associated with one delay element in a one-to-one relationship, and wherein each bypass is activated in response to the first logic level presented at the input of the delay circuit, thereby passing the first logic level across each delay element substantially without delay, and deactivated in response to the second logic level presented at the input of the delay circuit, thereby passing the second logic level from the input of the delay circuit to the output of the delay circuit at a time delta substantially equal to or greater than the predetermined delay time of the at least two delay elements.

16. A clock generator, comprising:
an input buffer;
a NAND SR latch having a set input, a reset input and an output, wherein the set input is coupled to an output of the input buffer;
a delay circuit having an input and an output, wherein the output of the delay circuit is coupled to the reset input of the SR latch; and
an inverter coupled between the output of the NAND SR latch and the input of the delay circuit;
wherein the delay circuit comprises:
 at least one non-inverting delay element coupled between the input and the output of the delay circuit, each having an input and an output; and
 at least one bypass, each having an input, an output and a first pass gate coupled between its input and output, wherein the input of each bypass is coupled to the input of an associated delay element and the output of each bypass is coupled to the output of its associated delay element.

17. The clock generator of claim 16, wherein each first pass gate has a first transistor of a first polarity having a gate coupled to a node interposed between the input of a first delay element and the input of the delay circuit and a second transistor of an opposite polarity having a gate coupled to the node through an interposing inverter.

18. The clock generator of claim 17, further comprising:
a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

19. The clock generator of claim 16, wherein each first pass gate has a first transistor of a first polarity having a gate coupled to receive a control signal from the input of its associated delay element and a second transistor of an opposite polarity having a gate coupled to receive the control signal through an interposing inverter.

20. The clock generator of claim 19, further comprising:
a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

21. The clock generator of claim 16, wherein each delay element comprises:
a first inverter;
a second inverter; and
at least one capacitor interposed between the first inverter and the second inverter.

22. The clock generator of claim 16, wherein the delay circuit further comprises at least one additional delay element coupled between the input and output of the delay circuit and not having an associated bypass.

23. A memory device, comprising:
an array of memory cells;
a row access circuit coupled to the array of memory cells;
a column access circuit coupled to the array of memory cells;
an address decoder circuit coupled to the row access circuit and the column access circuit; and
a clock generator for generating an internal clock signal for synchronizing access commands to the array of memory cells, wherein the clock generator comprises:
 an input buffer for receiving an external clock signal; and
 a one-shot circuit coupled to the input buffer for providing the internal clock signal in response to the external clock signal, wherein the one-shot circuit comprises a delay circuit having at least one delay element and at least one associated bypass;
 wherein the one-shot circuit generates a first logic level in response to a completion of an output pulse of the internal clock signal and presents the first logic level to an input of the delay circuit, further wherein the first logic level activates the at least one associated bypass and propagates across each delay element substantially without delay; and
 wherein the one-shot circuit generates a second logic level in response to a beginning of an output pulse of the internal clock signal and presents the second logic level to the input of the delay circuit, further wherein the second logic level deactivates the at least one associated bypass and is passed to the output of the delay circuit at a time delta equal to or greater than a predetermined delay time of the at least one delay element.

24. A memory device, comprising:

an array of memory cells;

a row access circuit coupled to the array of memory cells;

a column access circuit coupled to the array of memory cells;

an address decoder circuit coupled to the row access circuit and the column access circuit; and a clock generator for generating an internal clock signal for synchronizing access commands to the array of memory cells, wherein the clock generator comprises:
   an input buffer for receiving an external clock signal; and
   a one-shot circuit coupled to the input buffer for providing the internal clock signal in response to the external clock signal, wherein the one-shot circuit comprises:
      a NAND SR latch having a set input, a reset input and an output, wherein the set input is coupled to an output of the input buffer; and
      a delay circuit having an input and an output, at least one delay element having a predetermined delay time coupled in series between the input and the output of the delay circuit, and at least one bypass coupled between the input and the output of the delay circuit in parallel with the at least one delay element, wherein the output of the delay circuit is coupled to the reset input of the SR latch, further wherein the input of the delay circuit is coupled to receive a first logic level indicative of a completion of an output pulse of the internal clock signal and to receive a second logic level indicative of a beginning of an output pulse of the internal clock signal;
      wherein the first logic level activates the at least one bypass and is passed from the input of the delay circuit to the output of the delay circuit substantially without delay; and
      wherein the second logic level deactivates the at least one bypass is passed from the input of the delay circuit to the output of the delay circuit at a time delta substantially equal to the predetermined delay time of the at least one delay element.

25. A memory device, comprising:

an array of memory cells;

a row access circuit coupled to the array of memory cells;

a column access circuit coupled to the array of memory cells;

an address decoder circuit coupled to the row access circuit and the column access circuit; and a clock generator for generating an internal clock signal for synchronizing access commands to the array of memory cells, wherein the clock generator comprises:
   an input buffer for receiving an external clock signal; and
   a one-shot circuit coupled to the input buffer for providing the internal clock signal in response to the external clock signal, wherein the one-shot circuit comprises:
      a NAND SR latch having a set input, a reset input and an output, wherein the set input is coupled to an output of the input buffer and wherein an output pulse is provided on the output of the SR latch; and
      a delay circuit having an input and an output, wherein the output of the delay circuit is coupled to the reset input of the SR latch, further wherein the input of the delay circuit is coupled to receive a first logic level indicative of a completion of an output pulse of the internal clock signal and to receive a second logic level indicative of a beginning of an output pulse of the internal clock signal, still further wherein the delay circuit comprises:
         at least two delay elements coupled in series and having a predetermined delay time, wherein the at least two delay elements are coupled between the input and the output of the delay circuit; and
         at least two bypasses, wherein each bypass is associated with one delay element in a one-to-one relationship, and wherein each bypass is activated in response to the first logic level, thereby passing the first logic level across each delay element substantially without delay, and deactivated in response to the second logic level, thereby passing the second logic level from the input of the delay circuit to the output of the delay circuit at a time delta substantially equal to or greater than the predetermined delay time of the at least two delay elements.

26. A memory device, comprising:

an array of memory cells;

a row access circuit coupled to the array of memory cells;

a column access circuit coupled to the array of memory cells;

an address decoder circuit coupled to the row access circuit and the column access circuit; and a clock generator for generating an internal clock signal for synchronizing access commands to the array of memory cells, wherein the clock generator comprises:
   an input buffer for receiving an external clock signal;
   a NAND SR latch having a set input, a reset input and an output for providing the internal clock signal, wherein the set input is coupled to an output of the input buffer;
   a delay circuit having an input and an output, wherein the output of the delay circuit is coupled to the reset input of the SR latch; and
   an inverter coupled between the output of the NAND SR latch and the input of the delay circuit;
   wherein the delay circuit comprises:
      at least one non-inverting delay element coupled between the input and the output of the delay circuit, each having an input and an output; and
      at least one bypass, each having an input, an output and a first pass gate coupled between its input and output, wherein the input of each bypass is coupled to the input of an associated delay element and the output of each bypass is coupled to the output of its associated delay element.

27. A memory device, comprising:

an array of memory cells;

a row access circuit coupled to the array of memory cells;

a column access circuit coupled to the array of memory cells;

an address decoder circuit coupled to the row access circuit and the column access circuit; and a clock generator for generating an internal clock signal for synchronizing access commands to the array of memory cells, wherein the clock generator comprises:
   an input buffer for receiving an external clock signal;

a NAND SR latch having a set input, a reset input and an output for providing the internal clock signal, wherein the set input is coupled to an output of the input buffer;

a delay circuit having an input and an output, wherein the output of the delay circuit is coupled to the reset input of the SR latch; and an inverter coupled between the output of the NAND SR latch and the input of the delay circuit;

wherein the delay circuit comprises:

at least one non-inverting delay element coupled between the input and the output of the delay circuit, each having an input and an output;

at least one bypass, each having an input, an output and a first pass gate coupled between its input and output, wherein the input of each bypass is coupled to the input of an associated delay element and the output of each bypass is coupled to the output of its associated delay element, further wherein each first pass gate has a first transistor of a first polarity having a gate coupled to a node interposed between the input of the delay circuit an input of a first delay element, and a second transistor of an opposite polarity having a gate coupled to the node through an interposing inverter; and at least one second pass gate, wherein a second pass gate is coupled between the output of each delay element and the output of that delay element's associated bypass, further wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

28. A synchronous flash memory device, comprising:

a plurality of memory banks containing non-volatile flash memory cells; and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator;

wherein the clock generator comprises:

an input buffer for receiving the system clock input signal as an external clock signal; and a one-shot circuit coupled to the input buffer for providing the internal clock signal in response to the external clock signal, wherein the one-shot circuit comprises a delay circuit having at least one delay element and at least one associated bypass;

wherein the one-shot circuit generates a first logic level in response to a completion of an output pulse of the internal clock signal and presents the first logic level to an input of the delay circuit, further wherein the first logic level activates the at least one associated bypass and propagates across each delay element substantially without delay; and wherein the one-shot circuit generates a second logic level in response to a beginning of an output pulse of the internal clock signal and presents the second logic level to the input of the delay circuit, further wherein the second logic level deactivates the at least one associated bypass and is passed to the output of the delay circuit at a time delta equal to or greater than a predetermined delay time of the at least one delay element.

29. A synchronous flash memory device, comprising:

a plurality of memory banks containing non-volatile flash memory cells; and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator;

wherein the clock generator comprises:

an input buffer for receiving the system clock input signal as an external clock signal; and a one-shot circuit coupled to the input buffer for providing the internal clock signal in response to the external clock signal, wherein the one-shot circuit comprises:

a NAND SR latch having a set input, a reset input and an output, wherein the set input is coupled to an output of the input buffer; and a delay circuit having an input and an output, at least one delay element having a predetermined delay time coupled in series between the input and the output of the delay circuit, and at least one bypass coupled between the input and the output of the delay circuit in parallel with the at least one delay element, wherein the output of the delay circuit is coupled to the reset input of the SR latch, further wherein the input of the delay circuit is coupled to receive a first logic level indicative of a completion of an output pulse of the internal clock signal and to receive a second logic level indicative of a beginning of an output pulse of the internal clock signal;

wherein the first logic level activates the at least one bypass and is passed from the input of the delay circuit to the output of the delay circuit substantially without delay; and wherein the second logic level deactivates the at least one bypass is passed from the input of the delay circuit to the output of the delay circuit at a time delta substantially equal to the predetermined delay time of the at least one delay element.

30. A synchronous flash memory device, comprising:

a plurality of memory banks containing non-volatile flash memory cells; and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator, wherein the clock generator comprises:

an input buffer for receiving the system clock input signal as an external clock signal; and a one-shot circuit coupled to the input buffer for providing the internal clock signal in response to the external clock signal, wherein the one-shot circuit comprises:

a NAND SR latch having a set input, a reset input and an output, wherein the set input is coupled to an output of the input buffer and wherein an output pulse is provided on the output of the SR latch; and a delay circuit having an input and an output, wherein the output of the delay circuit is coupled to the reset input of the SR latch, further wherein the input of the delay circuit is coupled to receive a first logic level indicative of a completion of an output pulse of the internal clock signal and to receive a second logic level indicative of a beginning of an output pulse of the internal clock signal, still further wherein the delay circuit comprises:

at least two delay elements coupled in series and having a predetermined delay time, wherein the at least two delay elements are coupled between the input and the output of the delay circuit; and at least two bypasses, wherein each bypass is associated with one delay element in a one-to-one relationship, and wherein each bypass is activated in response to the first logic level, thereby passing the first logic level across each delay element substantially without delay, and deactivated in response to the second logic level, thereby passing the second logic level from the input of the delay circuit to the output of the delay circuit at a time delta substantially equal to or greater than the predetermined delay time of the at least two delay elements.

31. A synchronous flash memory device, comprising:

a plurality of memory banks containing non-volatile flash memory cells; and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator;

wherein the clock generator comprises:

an input buffer for receiving the system clock input signal as an external clock signal;

a NAND SR latch having a set input, a reset input and an output for providing the internal clock signal, wherein the set input is coupled to an output of the input buffer;

a delay circuit having an input and an output, wherein the output of the delay circuit is coupled to the reset input of the SR latch; and an inverter coupled between the output of the NAND SR latch and the input of the delay circuit;

wherein the delay circuit comprises:

at least one non-inverting delay element coupled between the input and the output of the delay circuit, each having an input and an output; and at least one bypass, each having an input, an output and a first pass gate coupled between its input and output, wherein the input of each bypass is coupled to the input of an associated delay element and the output of each bypass is coupled to the output of its associated delay element.

32. A synchronous flash memory device. comprising:

a plurality of memory banks containing non-volatile flash memory cells; and a command execution logic coupled to the plurality of memory banks for receiving at least a system clock input signal and for generating commands to control operations performed on the plurality of memory banks, wherein the commands are synchronized to an internal clock signal generated from the system clock input signal by a clock generator;

wherein the clock generator comprises:

an input buffer for receiving the system clock input signal as an external clock signal;

a NAND SR latch having a set input, a reset input and an output for providing the internal clock signal, wherein the set input is coupled to an output of the input buffer;

a delay circuit having an input and an output, wherein the output of the delay circuit is coupled to the reset input of the SR latch; and an inverter coupled between the output of the NAND SR latch and the input of the delay circuit;

wherein the delay circuit comprises:

at least one non-inverting delay element coupled between the input and the output of the delay circuit, each having an input and an output;

at least one bypass, each having an input an output and a first pass gate coupled between its input and output, wherein the input of each bypass is coupled to the input of an associated delay element and the output of each bypass is coupled to the output of its associated delay element, further wherein each first pass gate has a first transistor of a first polarity having a gate coupled to a node interposed between the input of the delay circuit and an input of a first delay element, and a second transistor of an opposite polarity having a gate coupled to the input of the delay circuit through an interposing inverter; and at least one second pass gate, wherein a second pass gate is coupled between the output of each delay element and the output of that delay element's associated bypass, further wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

33. A clock generator, comprising:

an input buffer for receiving an external clock signal; and a one-shot circuit coupled to the input buffer for providing output pulses in response to the external clock signal, wherein the one-shot circuit comprises:

a NAND SR latch having a set input, a reset input and an output, wherein the set input is coupled to an output of the input buffer; and a delay circuit having an input and an output, at least one delay element having a predetermined delay time coupled in series between the input and the output of the delay circuit, and at least one bypass coupled between the input and the output of the delay circuit in parallel with the at least one delay element, wherein the output of the delay circuit is coupled to the reset input of the SR latch, further wherein the input of the delay circuit is coupled to receive a first logic level indicative of a completion of an output pulse and to receive a second logic level indicative of a beginning of an output pulse;

wherein each at least one delay element comprises a first inverter, a second inverter, and at least one capacitor interposed between the first inverter and the second inverter;

wherein each at least one associated bypass comprises an input, an output, and a first pass gate coupled between the input and output, further wherein the first pass gate has a first transistor of a first polarity having a gate coupled to a node interposed between the input of the delay circuit and the input of a first delay element, and a second transistor of an opposite polarity having a gate coupled to the node through an interposing inverter;

wherein the input of each bypass is coupled to an input of its associated delay element and the output of each bypass is coupled to an output of its associated delay element;

wherein the first logic level activates the at least one bypass and is passed from the input of the delay circuit to the output of the delay circuit substantially without delay; and wherein the second logic level deactivates the at least one bypass is passed from the input of the delay circuit to the output of the delay circuit at a time delta substantially equal to the predetermined delay time of the at least one delay element.

34. The clock generator of claim 33, further comprising:
a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

35. A clock generator, comprising:
an input buffer;
a NAND SR latch having a set input, a reset input and an output, wherein the set input is coupled to an output of the input buffer;
a delay circuit having an input and an output, wherein the output of the delay circuit is coupled to the reset input of the SR latch; and
an inverter coupled between the output of the NAND SR latch and the input of the delay circuit;
wherein the delay circuit comprises:
at least one non-inverting delay element coupled between the input and the output of the delay circuit, each having an input and an output;
at least one bypass, each having an input, an output and a first pass gate coupled between its input and output, wherein the input of each bypass is coupled to the input of an associated delay element and the output of each bypass is coupled to the output of its associated delay element, further wherein each first pass gate has a first transistor of a first polarity having a gate coupled to a node interposed between the input of the delay circuit and the input of a first delay element, and a second transistor of an opposite polarity having a gate coupled to the node through an interposing inverter; and
at least one second pass gate, wherein a second pass gate is coupled between the output of each delay element and the output of that delay element's associated bypass, further wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

36. The clock generator of claim 35, wherein each delay element comprises:
a first inverter;
a second inverter; and
at least one capacitor interposed between the first inverter and the second inverter.

37. The clock generator of claim 35, wherein the delay circuit further comprises at least one additional delay element coupled between the input and output of the delay circuit and not having an associated bypass.

38. A method of generating output pulses of an internal clock signal in response to an external clock signal, comprising:
applying a first signal indicative of the external clock signal to a set input of an SR latch;
generating output pulses of the internal clock signal on an output of the SR latch in response to signals applied to the set input and a reset input of the SR latch, wherein an output pulse begins in response to a falling edge of the first signal applied to the set input, and wherein an output pulse is completed in response to a falling edge of a second signal applied to the reset input;
generating a first logic level indicative of a completion of an output pulse of the internal clock signal;
generating a second logic level indicative of a beginning of an output pulse of the internal clock signal;
applying the first and second logic levels to an input of a delay circuit comprising at least one delay element and at least one bypass, wherein each delay element has an associated bypass;
activating each bypass in response to the first logic level applied to the input of the delay circuit, thereby bypassing each delay element and passing the first logic level to an output of the delay circuit substantially without delay;
deactivating each bypass in response to the second logic level applied to the input of the delay circuit, thereby allowing the second logic level to propagate through each delay element and passing the second logic level to the output of the delay circuit at a time delta substantially equal to a predetermined delay time of the at least one delay element; and
applying the logic level from the output of the delay circuit to a reset input of the SR latch as the second signal.

39. A method of synchronizing memory device access commands to an external clock signal, comprising:
applying a signal indicative of the external clock signal to a set input of an SR latch;
generating an output signal on an output of the SR latch in response to logic levels applied to the set input and a reset input of the SR latch, wherein the output signal is an internal clock signal;
generating a first logic level indicative of a completion of an output pulse of the internal clock signal;
generating a second logic level indicative of a beginning of an output pulse of the internal clock signal;
applying the first and second logic levels to an input of a delay circuit comprising at least one delay element and at least one bypass, wherein each delay element has an associated bypass;

activating each bypass in response to the first logic level applied to the input of the delay circuit, thereby bypassing each delay element and passing the first logic level to an output of the delay circuit substantially without delay;

deactivating each bypass in response to the second logic level applied to the input of the delay circuit, thereby allowing the second logic level to propagate through each delay element and passing the second logic level to the output of the delay circuit at a time delta substantially equal to a predetermined delay time of the at least one delay element;

applying the logic level from the output of the delay circuit to a reset input of the SR latch; and synchronizing the access commands to the resulting internal clock signal, thereby synchronizing the access commands to the external clock signal.

40. A delay circuit, comprising:

an input;

an output;

at least one delay element having an input and an output, wherein each delay element is coupled between the input and the output of the delay circuit in series with other delay elements; and at least one bypass associated with each delay element, each bypass having an input, an output, and a first pass gate coupled between the input and the output of each bypass, wherein the input of each bypass is coupled to the input of its associated delay element and the output of each bypass is coupled to the output of its associated delay element;

wherein each first pass gate is activated in response to a first logic level presented at the input of the delay circuit and each first pass gate is deactivated in response to a second logic level presented at the input of the delay circuit.

41. The delay circuit of claim 40, wherein each first pass gate has a first transistor of a first polarity having a gate coupled to a node interposed between the input of the delay circuit the input of a first delay element, and a second transistor of an opposite polarity having a gate coupled to the node through an interposing inverter.

42. The delay circuit of claim 41, further comprising:

a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

43. The delay circuit of claim 40, wherein each first pass gate has a first transistor of a first polarity having a gate coupled to receive a control signal from the input of its associated delay element, and a second transistor of an opposite polarity having a gate coupled to receive the control signal through an interposing inverter.

44. The delay circuit of claim 43, further comprising:

a second pass gate coupled between the output of each delay element and the output of that delay element's associated bypass, wherein each second pass gate has a first transistor of the first polarity having a gate coupled to the gate of the second transistor of the first pass gate of the associated bypass, and wherein each second pass gate has a second transistor of the opposite polarity having a gate coupled to the gate of the first transistor of the first pass gate of the associated bypass.

45. The delay circuit of claim 40, wherein the delay circuit further comprises at least one additional delay element coupled between the input and output of the delay circuit and not having an associated bypass.

46. The delay circuit of claim 40, wherein the delay circuit further comprises at least one additional delay element coupled in parallel with another delay element.

47. The delay circuit of claim 40, wherein each at least one delay element comprises:

a first inverter;

a second inverter; and at least one capacitor interposed between the first inverter and the second inverter.

48. A delay circuit, comprising:

an input;

an output;

at least one delay element having an input and an output, wherein each delay element is coupled between the input and the output of the delay circuit in series with other delay elements;

a first pass gate associated with each delay element, wherein each first pass gate has an input and an output, further wherein the input of each first pass gate is coupled to the input of its associated delay element and the output of each first pass gate is coupled to the output of its associated delay element;

a second pass gate associated with each delay element, wherein each second pass gate has an input and an output, further wherein the input of each second pass gate is coupled to the output of its associated delay element and the output of each second pass gate is coupled to the output of the first pass gate associated with the second pass gate's associated delay element;

wherein each first pass gate is activated in response to a first logic level presented at the input of the delay circuit and each first pass gate is deactivated in response to a second logic level presented at the input of the delay circuit; and wherein each second pass gate is deactivated in response to the first logic level presented at the input of the delay circuit and each second pass gate is activated in response to the second logic level presented at the input of the delay circuit.

49. The delay circuit of claim 48, wherein each first pass gate has a first transistor of a first polarity having a gate coupled to a node interposed between the input of the delay circuit and the input of a first delay element, and a second transistor of an opposite polarity having a gate coupled to the node through an interposing inverter, and wherein each second pass gate has a first transistor of the first polarity having a gate coupled to the node through an interposing inverter, and a second transistor of the opposite polarity having a gate coupled to the node.

50. The delay circuit of claim 48, wherein each at least one delay element comprises:

a first inverter;

a second inverter; and at least one capacitor interposed between the first inverter and the second inverter.

51. A delay circuit, comprising:

an input;

an output;

at least one delay element having an input and an output, wherein each delay element is coupled between the input and the output of the delay circuit in series with other delay elements, further wherein each delay element comprises a first inverter coupled to the input of the delay element, a second inverter coupled to the output of the delay element, and at least one capacitor interposed between the first inverter and the second inverter;

a first pass gate associated with each delay element, wherein each first pass gate has an input and an output, further wherein the input of each first pass gate is coupled to the input of its associated delay element and the output of each first pass gate is coupled to the output of its associated delay element; and a second pass gate associated with each delay element, wherein each second pass gate has an input and an output, further wherein the input of each second pass gate is coupled to the output of its associated delay element and the output of each first pass gate is coupled to the output of the first pass gate associated with the second pass gate's associated delay element;

wherein each first pass gate has a first transistor of a first polarity having a gate coupled to a node interposed between the input of the delay circuit and the input of a first delay element, and a second transistor of an opposite polarity having a gate coupled to the node through an interposing inverter; and wherein each second pass gate has a first transistor of the first polarity having a gate coupled to the node through an interposing inverter and a second transistor of the opposite polarity having a gate coupled to the node.

52. A memory assembly, comprising:

a memory package having a plurality of interconnects; and a memory device contained in the memory package, wherein the memory device comprises:

an array of memory cells; and a clock generator for generating an internal clock signal for synchronizing access commands to the array of memory cells, wherein the clock generator comprises:

an input buffer for receiving an external clock signal; and a one-shot circuit coupled to the input buffer for providing the internal clock signal in response to the external clock signal, wherein the one-shot circuit comprises a delay circuit having at least one delay element and at least one associated bypass;

wherein the one-shot circuit generates a first logic level in response to a completion of an output pulse of the internal clock signal and presents the first logic level to an input of the delay circuit, further wherein the first logic level activates the at least one associated bypass and propagates across each delay element substantially without delay; and wherein the one-shot circuit generates a second logic level in response to a beginning of an output pulse of the internal clock signal and presents the second logic level to the input of the delay circuit, further wherein the second logic level deactivates the at least one associated bypass and is passed to the output of the delay circuit at a time delta equal to or greater than a predetermined delay time of the at least one delay element;

address inputs coupled between the memory array and a first portion of the plurality of interconnects of the memory package; and data inputs/outputs coupled between the memory array and a second portion of the plurality of interconnects of the memory package.

53. An electronic system, comprising:

a processor; and a memory device coupled to the processor, wherein the memory device comprises:

an array of memory cells; and a clock generator for generating an internal clock signal for synchronizing access commands to the array of memory cells, wherein the clock generator comprises:

an input buffer for receiving an external clock signal; and a one-shot circuit coupled to the input buffer for providing the internal clock signal in response to the external clock signal, wherein the one-shot circuit comprises a delay circuit having at least one delay element and at least one associated bypass;

wherein the one-shot circuit generates a first logic level in response to a completion of an output pulse of the internal clock signal and presents the first logic level to an input of the delay circuit, further wherein the first logic level activates the at least one associated bypass and propagates across each delay element substantially without delay; and wherein the one-shot circuit generates a second logic level in response to a beginning of an output pulse of the internal clock signal and presents the second logic level to the input of the delay circuit, further wherein the second logic level deactivates the at least one associated bypass and is passed to the output of the delay circuit at a time delta equal to or greater than a predetermined delay time of the at least one delay element;

a plurality of address inputs coupled between the processor and the memory array; and a plurality of data inputs/outputs coupled between the processor and the memory array.

* * * * *